(12) United States Patent
Seok et al.

(10) Patent No.: US 10,090,135 B2
(45) Date of Patent: Oct. 2, 2018

(54) METHODS OF FORMING COATING LAYERS

(71) Applicant: SAMSUNG ELECTRONICS CO., LTD, Suwon-si, Gyeonggi-do (KR)

(72) Inventors: Chul-Kyun Seok, Hwaseong-si (KR); Tae-Kyun Kang, Hwaseong-si (KR); Chang-Won Choi, Anyang-si (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 145 days.

(21) Appl. No.: 15/015,158

(22) Filed: Feb. 4, 2016

(65) Prior Publication Data

US 2016/0351376 A1    Dec. 1, 2016

(30) Foreign Application Priority Data

May 29, 2015    (KR) .......................... 10-2015-0075989

(51) Int. Cl.
| | |
|---|---|
| *H01J 37/32* | (2006.01) |
| *C23C 4/134* | (2016.01) |
| *B01J 2/00* | (2006.01) |
| *B01J 2/06* | (2006.01) |
| *C23C 4/10* | (2016.01) |

(52) U.S. Cl.
CPC ......... *H01J 37/32495* (2013.01); *B01J 2/003* (2013.01); *B01J 2/06* (2013.01); *C23C 4/10* (2013.01); *C23C 4/134* (2016.01); *H01J 2237/332* (2013.01)

(58) Field of Classification Search
None
See application file for complete search history.

(56) References Cited

U.S. PATENT DOCUMENTS

| | | | |
|---|---|---|---|
| 7,198,462 B2 | 4/2007 | Merrill et al. | |
| 2002/0076642 A1 | 6/2002 | Zampini et al. | |
| 2003/0129320 A1* | 7/2003 | Yu .......................... | C04B 38/009 427/453 |
| 2004/0002221 A1 | 1/2004 | O'Donnell et al. | |
| 2004/0033884 A1* | 2/2004 | Wallar ...................... | C23C 4/11 501/103 |
| 2007/0036705 A1* | 2/2007 | Butts ....................... | C01B 33/18 423/335 |
| 2008/0167173 A1 | 7/2008 | Lima et al. | |
| 2009/0074961 A1* | 3/2009 | Kulkarni ................... | C23C 4/02 427/203 |
| 2009/0324910 A1 | 12/2009 | Gemici et al. | |
| 2010/0211158 A1 | 8/2010 | Haverty et al. | |

(Continued)

FOREIGN PATENT DOCUMENTS

| | | |
|---|---|---|
| JP | 2004-511006 A | 4/2004 |
| JP | 2010-131592 A | 6/2010 |

(Continued)

*Primary Examiner* — Shamim Ahmed
*Assistant Examiner* — Bradford M Gates
(74) *Attorney, Agent, or Firm* — Lee & Morse, P.C.

(57) ABSTRACT

A method of forming a coating layer, including preparing hollow inorganic particles, each hollow inorganic particle including a shell surrounding a hollow core; preparing inorganic coating particles of a solid structure; forming a mixture of the hollow inorganic particles and the inorganic coating particles; and spraying the mixture on a surface of a base by a plasma spray coating process.

19 Claims, 15 Drawing Sheets

(56) References Cited

U.S. PATENT DOCUMENTS

| | | | |
|---|---|---|---|
| 2012/0118318 A1 | 5/2012 | Hillebrandt Poulsen et al. | |
| 2012/0177908 A1 | 7/2012 | Petorak et al. | |
| 2012/0272869 A1* | 11/2012 | Shaw ................... | C01G 39/06 |
| | | | 106/287.18 |
| 2013/0255499 A1 | 10/2013 | Gindrat et al. | |
| 2015/0011668 A1 | 1/2015 | Kolb et al. | |

FOREIGN PATENT DOCUMENTS

| | | |
|---|---|---|
| JP | 2011-524289 A | 9/2011 |
| KR | 10-2010-0100801 A | 9/2010 |
| KR | 10-1107542 B1 | 2/2012 |
| KR | 10-2014-0124805 A | 10/2014 |

* cited by examiner

METHODS OF FORMING COATING LAYERS

CROSS-REFERENCE TO RELATED APPLICATION

Korean Patent Application No. 10-2015-0075989, filed on May 29, 2015, in the Korean Intellectual Property Office, and entitled: "Methods of Forming Coating Layers, Plasma Treatment Apparatuses and Methods of Forming Patterns," is incorporated by reference herein in its entirety.

BACKGROUND

1. Field

Example embodiments relate to methods of forming coating layer, plasma treatment apparatus and methods of forming patterns.

2. Description of the Related Art

In a semiconductor fabrication such as an etching process or a layer treatment, a plasma treatment apparatus may be utilized. An additional coating layer may be formed on, e.g., an inner surface of the plasma treatment apparatus, and durability and reliability of the apparatus and the semiconductor fabrication may be improved. The coating layer may be damaged while performing a plasma treatment at a high temperature, and defect factors in the semiconductor fabrication may be generated.

SUMMARY

Embodiments may be realized by providing a method of forming a coating layer, the method including preparing hollow inorganic particles, each hollow inorganic particle including a shell surrounding a hollow core; preparing inorganic coating particles of a solid structure; forming a mixture of the hollow inorganic particles and the inorganic coating particles; and spraying the mixture on a surface of a base by a plasma spray coating process.

The inorganic coating particles may include one or more of yttria, alumina, zirconia, silica, yttrium fluoride, silicon carbide, or yttria-stabilized zirconia.

Preparing the hollow inorganic particles may include synthesizing a core layer including a polymeric material; surface-treating the core layer; forming the shell including an inorganic material on a surface of the core layer; and removing the core layer.

The shell may be formed using powder of one or more of yttria, alumina, zirconia, silica, yttrium fluoride, silicon carbide, or yttria-stabilized zirconia.

Synthesizing the core layer may include a liquid-phase polymerization of monomers.

Surface-treating the core layer may include forming a surface activation layer on the surface of the core layer.

Removing the core layer may include a thermal decomposition or an evaporation of the core layer by a thermal treatment.

Spraying the mixture on the surface of the base by the plasma spray coating process may be divided into a plurality of cycles.

The mixture may be injected in a plasma spray coating apparatus as a plurality of mixture batches.

The method may further include controlling a ratio of the hollow inorganic particles to the inorganic coating particles included in each mixture batch such that a distribution of the hollow inorganic particles in the coating layer formed on the surface of the base is adjusted.

A majority of particles at a contact surface of the coating layer with the base may be hollow inorganic particles.

A majority of particles at a contact surface with the base and an outer surface of the coating layer may be hollow inorganic particles.

An area of the coating layer between the contact surface and the outer surface may consist essentially of the inorganic coating particles.

An amount of the hollow inorganic particles in the coating layer may be in a range from about 5 weight percent to about 60 weight percent based on a total weight of the coating layer.

Embodiments may be realized by providing a method of forming a coating layer, the method including preparing hollow inorganic particle precursors, each hollow inorganic particle precursor including a polymer core layer and a shell surrounding the polymer core layer; preparing inorganic coating particles of a solid structure; forming a mixture of the hollow inorganic particle precursors and the inorganic coating particles; and spraying the mixture on a surface of a base by a plasma spray coating process.

Spraying the mixture may include transforming the hollow inorganic particle precursors into hollow inorganic particles from which the polymer core layer is removed.

The method may further include injecting the mixture into a powder injection port of a plasma spray coating apparatus. The mixture may pass a spraying port of the plasma spray coating apparatus to form the hollow inorganic particles.

The shell and the inorganic coating particles may include one or more of yttria, alumina, zirconia, silica, yttrium fluoride, silicon carbide, or yttria-stabilized zirconia.

A plasma treatment apparatus, including a chamber; a supporter on which a substrate is loaded in the chamber; an electric field applying unit at an upper portion of the chamber; a power supply coupled to the supporter and the electric field applying unit; a reactive gas supply in communication with an inside of the chamber; and a coating layer formed on an inner wall of the chamber, the coating layer including hollow inorganic particles and inorganic coating particles of a solid structure.

The plasma treatment apparatus may further include a liner formed on the inner wall of the chamber; and a window providing a space for the electric field applying unit. The coating layer may be formed on one or more of the liner or the window.

The coating layer may include a contact portion contacting a surface of the liner or a surface of the window; an outer portion exposed to the inside of the chamber; and an intermediate portion between the contact portion and the outer portion.

A majority of particles in the contact portion may be hollow inorganic particles.

The hollow inorganic particles may be distributed in the contact portion and the outer portion, and the intermediate portion may consist essentially of the inorganic coating particles.

The hollow inorganic particles may be distributed throughout the contact portion, the intermediate portion, and the outer portion, and an amount of the hollow inorganic particles in the intermediate portion may be less than an amount of the hollow inorganic particles in the contact portion and an amount of the hollow inorganic particles in the outer portion.

Each hollow inorganic particle may include a shell surrounding a hollow core, and a hollow area of the hollow inorganic particles per unit area of the coating layer may be in a range from about 1% to about 50%.

Each hollow inorganic particle may include a shell surrounding a hollow core, and the shell and the inorganic coating particles may include one or more of yttria, alumina, zirconia, silica, yttrium fluoride, silicon carbide, or yttria-stabilized zirconia.

Embodiments may be realized by providing a method of forming a pattern, the method including forming an object layer on a substrate; loading the substrate in a plasma etching apparatus, the plasma etching apparatus including a coating layer on an inner wall thereof, the coating layer including hollow inorganic particles and inorganic coating particles of a solid structure; and patterning the object layer by a plasma etching process.

The method may further include unloading the substrate including the object layer patterned by the plasma etching process; cleaning the plasma etching apparatus to remove the coating layer; and forming again a coating layer on the inner wall of the plasma etching apparatus, the coating layer including the hollow inorganic particles and the inorganic coating particles of the solid structure.

The coating layer may be formed by a plasma spray coating process.

The plasma spray coating process may be performed using a plurality of mixture batches that include the hollow inorganic particles and the inorganic coating particles.

Embodiments may be realized by providing a method of forming a coating layer, including forming multiple spray coatings using one or more of hollow inorganic particles or solid inorganic coating particles, the multiple spray coatings having different weight ratios of the hollow inorganic particles and the solid inorganic coating particles; and spraying a coating layer including the hollow inorganic particles and the solid inorganic coating particles on an inner wall of a plasma treatment apparatus chamber by a plasma spray coating process in a plurality of cycles, each of the plurality of cycles using a different spray coating among the multiple spray coatings.

The method may further include controlling a distribution of the hollow inorganic particles in the coating layer by adjusting weight ratios of each of the spray coatings. A portion of the coating layer contacting the inner wall of the plasma treatment apparatus chamber may consist essentially of at least a portion of the hollow inorganic particles.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
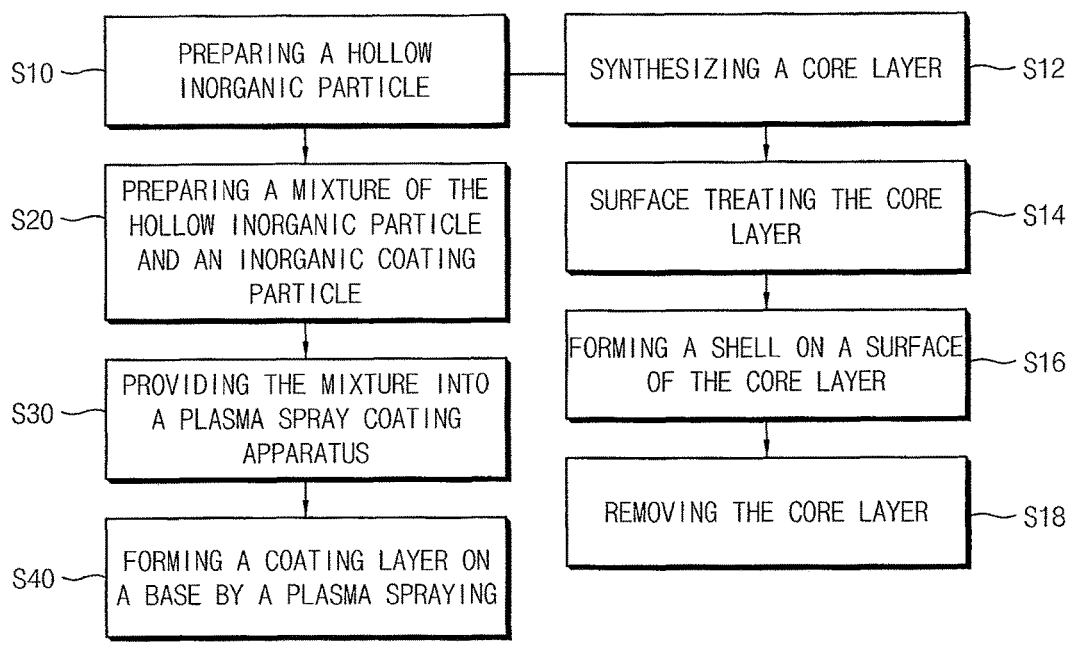
FIG. 1 illustrates a flow chart of a method of forming a coating layer in accordance with example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to be limiting.

Unless otherwise defined, all terms (including technical and scientific terms) used herein have the same meaning as commonly understood by one of skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
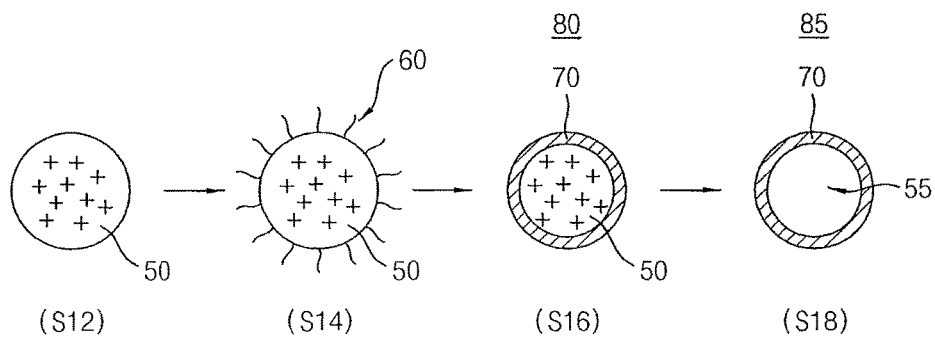
FIG. 2 illustrates a schematic view of a method of forming a hollow inorganic particle in accordance with example embodiments.
Figure 3:
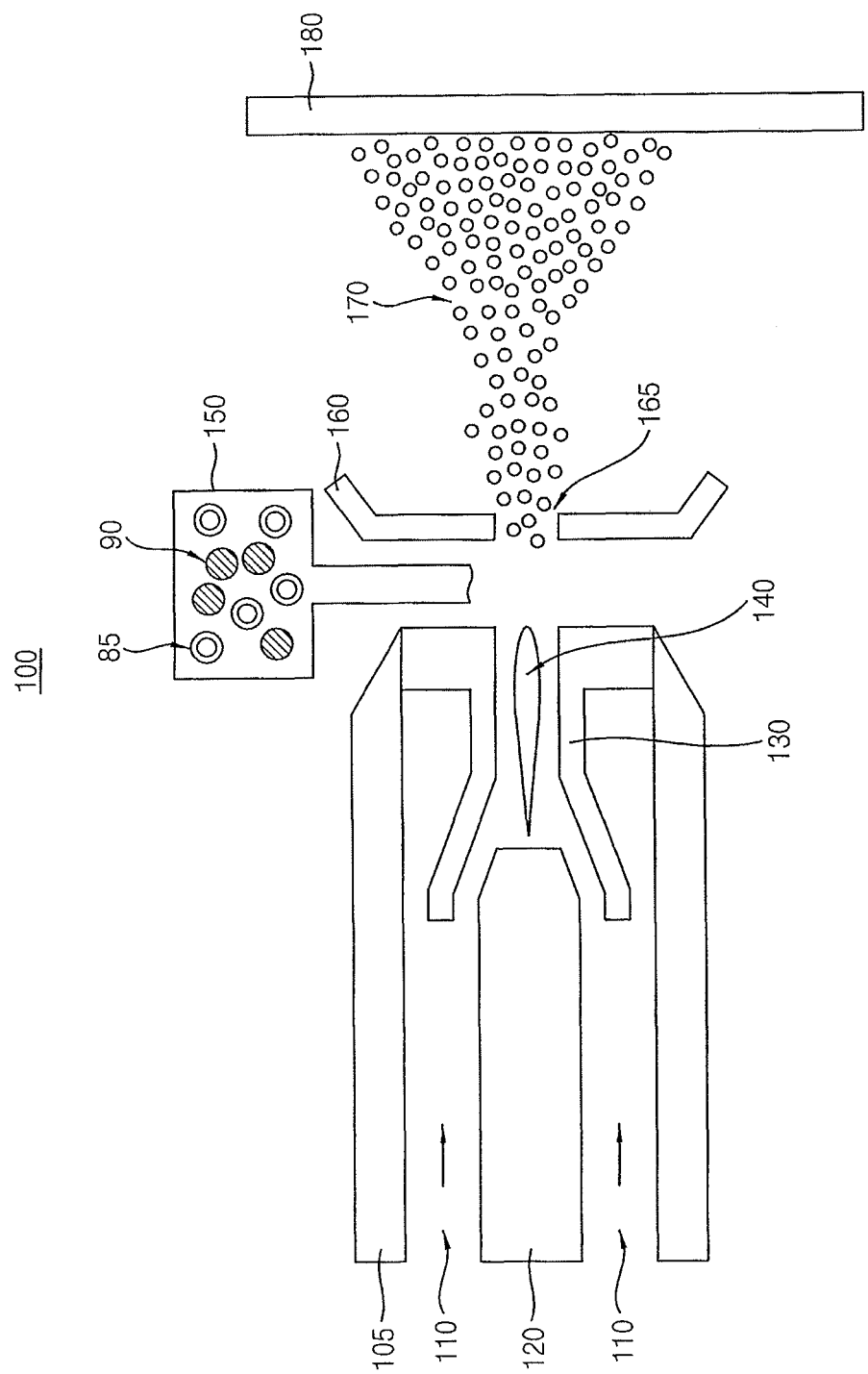
FIG. 3 illustrates a schematic cross-sectional view of a plasma spray coating method in accordance with example embodiments.

FIG. 1 illustrates a flow chart of a method of forming a coating layer in accordance with example embodiments. FIG. 2 illustrates a schematic view of a method of forming a hollow inorganic particle in accordance with example embodiments. FIG. 3 illustrates a schematic cross-sectional view of a plasma spray coating method in accordance with example embodiments.

Referring to FIGS. 1 and 2, in, e.g., an operation S10, a hollow inorganic particle may be prepared.

As illustrated in FIG. 2, the hollow inorganic particle 85 may include a hollow core 55 surrounded by a shell 70. The shell 70 may include an inorganic material, e.g., yttria ($Y_2O_3$), alumina ($Al_2O_3$), zirconia ($ZrO_2$), silica ($SiO_2$), yttrium fluoride ($YF_3$), silicon carbide (SiC) or yttria-stabilized zirconia (YSZ). These may be used alone or in a combination thereof.

Hereinafter, a method of preparing the hollow inorganic particle 85 may be described with reference to FIGS. 1 and 2.

For example, in an operation S12, a core layer 50 may be synthesized.

In example embodiments, the core layer 50 may include a polymeric material. For example, the core layer 50 may include a polymer such as polystyrene, polyester, polyethylene, polyethylene terephthalate, polyacrylate, polyamide, poly vinyl chloride, polypropylene and polyimide, or a copolymer thereof. These may be used alone or in a combination thereof.

In some embodiments, the core layer 50 may be synthesized by a liquid-phase polymerization. For example, monomers of the above-mentioned polymeric material such as, for example, acrylonitrile, vinylidene chloride, methyl(meth) acrylate, or chloro styrene, may be dissolved in an organic solvent to prepare a precursor solution. A polymerization initiator may be added in the precursor solution, and stirred moderately, the monomers may be polymerized in a particle form, and a polymer solution including the core layers 50 may be prepared.

Examples of the polymerization initiator may include peroxide such as peroxy dicarbonate, peroxy ester and diacylperoxide, or an azo-based compound. These may be used alone or in a combination thereof.

A solvent having an improved solubility with respect to the polymeric material such as alkane, cyclohexane, toluene and oleyl alcohol may be used as the organic solvent.

The core layers 50 having the particle form may be dispersed in the polymer solution. In some embodiments, a dispersion stabilizer may be added for facilitating the dispersion of the core layers 50. The dispersion stabilizer may include, e.g., polyvinyl pyrrolidone, methyl cellulose, polyethylene oxide, or polyvinyl alcohol.

For example, in an operation S14, the core layer 50 may be surface-treated to form a surface activation layer 60 on a surface of the core layer 50. As illustrated in FIG. 2, a surface activation moiety may be attached to the surface of the core layer 50, and the surface activation layer 60 may be formed.

In some embodiments, a surface activation agent may be added in the polymer solution to form the surface activation layer 60. Example of the surface activation agent may include, for example, sorbitan monolaurate (SPAN®-20), sorbitan monostearate (SPAN®-60), sorbitan monooleate (SPAN®-80), PEO(20)-sorbitan monolaurate (TWEEN®-20), PEO(20)-sorbitan monostearate (TWEEN®-60), and PEO(20)-sorbitan monooleate (TWEEN®-80). These may be used alone or in a combination thereof. An amine-based compound such as ethyl amine or ethylene diamine may be also used as the surface activation agent.

For example, in an operation S16, the shell 70 may be formed on the surface of the core layer 50, and particles having a core-shell structure may be synthesized.

In some embodiments, an inorganic particle powder may dissolved in the polymer solution in which the surface-treated core layers 50 may be dispersed, and stirred to form the shell 70 coated on the core layer 50.

The inorganic particle powder may be dissolved in an aqueous solution, and then may be mixed with the polymer solution. An aqueous dispersion stabilizer such as colloidal silica, colloidal calcium carbonate, magnesium hydroxide or calcium hydroxide may be added to facilitate a mixing of the polymer solution and the aqueous solution.

The inorganic particle powder may include a commercially available inorganic nano particle. For example, yttria, alumina, silica, zirconia, yttrium fluoride, silicon carbide and/or YSZ may be used as the inorganic particle powder. These may be used alone or in a combination thereof.

For example, the surface of the core layer 50 may become hydrophilic-treated by the surface activation layer 60, and the core layer 50 may be easily coated by the shell 70.

The solution in which the core layers 50 coated by the shell 70 may be dispersed may be filtered, dried and/or thermally treated to obtain a hollow inorganic particle precursor 80 as a powder form.

For example, in an operation S18, the core layer 50 may be removed from the hollow inorganic particle precursor 80 to form a hollow inorganic particle 85.

In some embodiments, the hollow inorganic particle precursor 80 may be sintered in a predetermined temperature and the core layer 50 may be thermally decomposed. The polymeric material included in the core layer 50 may be removed by evaporation or combustion to form a hollow core 55, and the hollow inorganic particle 85 may be defined by the shell 70 surrounding the hollow core 55.

For example, the sintering treatment may be performed at a temperature in a range of about 500° C. to about 1,200° C. The temperature of the sintering treatment may be selected according to a type of the polymeric material.

In example embodiments, the hollow inorganic particle 85 may be formed as a nano-scale particle having a diameter between about 50 nm to about 100 nm.

Referring again to FIG. 1, in, e.g., an operation of S20, a mixture of the hollow inorganic particle 85 formed by processes as described above and an inorganic coating particle may be prepared.

The inorganic coating particle may be injected onto, e.g., a base metal to form a coating layer. For example, a commercially available inorganic nano particle may be used as the inorganic coating particle. In some embodiments, yttria, alumina, silica, zirconia, yttrium fluoride, silicon carbide and/or YSZ may be used as the inorganic coating particle. These may be used alone or in a combination thereof. The inorganic coating particle may have a solid structure.

Referring to FIGS. 1 and 3, in, e.g., an operation S30, the mixture may be introduced into a plasma spray coating apparatus.

As illustrated in FIG. 3, a plasma spray coating apparatus 100 may include a body 105, a cathode 120, an anode 130, a gas inlet 110, a powder injection port 150 and a spraying port 160. In some embodiments, the plasma spray coating apparatus 100 may further include a water flow path for cooling the cathode 120 and the anode 130.

For example, in an operation S40, a coating layer may be formed on a base 180 (e.g., the base metal) by a plasma spraying method.

A plasma gas including, e.g., argon, nitrogen, or helium, may be introduced through the gas inlet 110 of the plasma spray coating apparatus 100 around the cathode 120. The plasma gas may enter the anode 130, and a high voltage discharge may occur between the cathode 120 and the anode 130 to generate a plasma flame 140.

The mixture of the hollow inorganic particle 85 and the inorganic coating particle 90 may be stored in the powder injection port 150, and the mixture may be introduced into the plasma flame 140. The mixture may be rapidly heated and melted, and may be sprayed through an opening 165 included in the spraying port 160 on a surface of the base 180.

The mixture may be sprayed as a melted mixture 170, and may be collided with the surface of the base 180 and cooled. The hollow inorganic particles 85 and the inorganic coating particles 90 may be attached to the base 180 to form a coating layer.

When the melted inorganic coating particles 90 are collided with the base 180, the melted inorganic coating particles 90 may be rapidly cooled on the surface of the base 180. A difference between coefficient of thermal expansions (CTEs) of the coating layer and the base 180 may be generated, and a residual stress may be caused in the coating layer. A bonding force between the base 180 and the inorganic coating particle 90 and/or between the inorganic coating particles 90 may be weakened, which may result in defects such as cracks and voids in the coating layer.

According to example embodiments, the hollow inorganic particle 85 having a relatively large elasticity may be used together with the inorganic coating particle 90. The residual stress may be absorbed or buffered by the hollow inorganic particle 85, and the coating layer having less cracks and voids, and having improved stability and reliability may be obtained.

FIGS. 4 to 7 illustrate cross-sectional views of structures of a coating layer in accordance with example embodiments.

Figure 4:
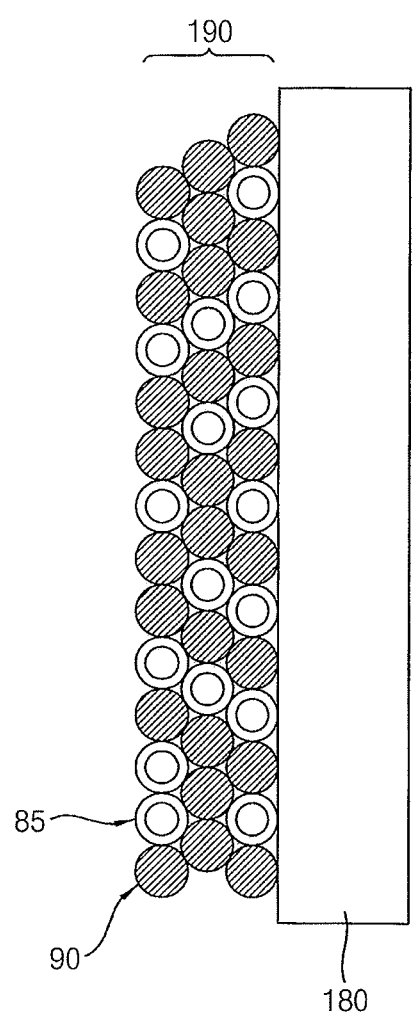
FIGS. 4 to 7 illustrate cross-sectional views of structures of a coating layer in accordance with example embodiments.

Referring to FIG. 4, the hollow inorganic particles 85 and the inorganic coating particles 90 may be substantially randomly distributed in a coating layer 190.

In some embodiments, an amount of the hollow inorganic particles 85 based on a total weight of the coating layer 190 may be controlled in a range from about 5 weight percent (wt %) to about 60 wt %.

If the amount, e.g., weight, of the hollow inorganic particles 85 is less than about 5 wt %, the residual stress in the coating layer 190 may not sufficiently absorbed, and cracks may be formed in the coating layer 190. If the amount of the hollow inorganic particles 85 exceeds about 60 wt %, a mechanical strength of the coating layer 190 may be degraded, and the coating layer 190 may be easily damaged by an external shock.

In some embodiments, a hollow area defined by the hollow cores 55 per unit area of the coating layer 190 may be in a range from about 1% to about 50%. If the hollow area defined by the hollow cores 55 per unit area of the coating layer 190 is less than about 1%, the residual stress may not be sufficiently absorbed. If the hollow area defined by the hollow cores 55 per unit area of the coating layer 190 exceeds about 50%, the mechanical strength of the coating layer 190 may be excessively reduced.

In some example embodiments, a distribution of the hollow inorganic particles 85 in the coating layer 190 may be determined in consideration of the residual stress and the external shock.

In some embodiments, the plasma spray coating as described above may be divided into a plurality of cycles. In each cycle, a mixture batch of the hollow inorganic particles 85 and the inorganic coating particles 90 may be stored in the powder injection port 150. An amount, e.g., weight, ratio of the hollow inorganic particles 85 to the inorganic coating particles 90 in the mixture batch may be changed according to the each cycle.

Figure 5:
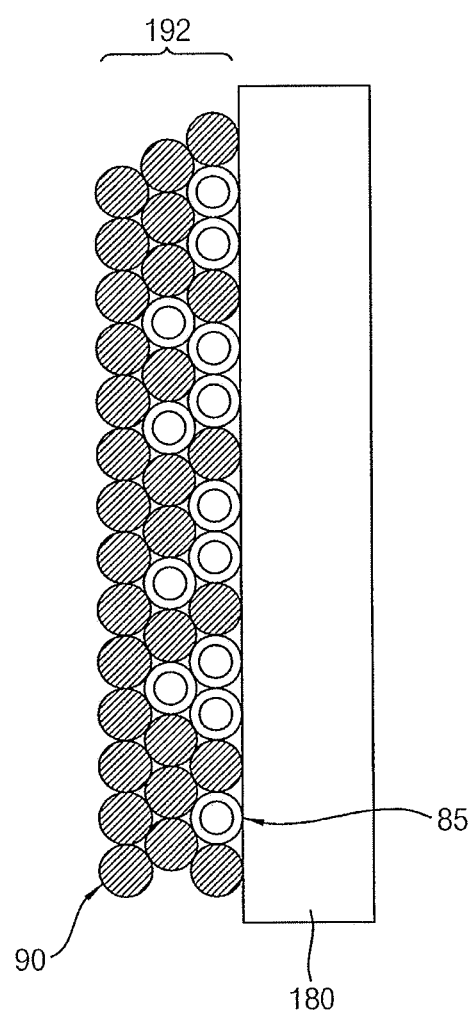

Referring to FIG. 5, the hollow inorganic particles 85 may be relatively concentrated at a contact surface between a coating layer 192 and the base 180. For example, the number of the hollow inorganic particles 85 may be greater than the number of the inorganic coating particles 90 at the contact surface, and the residual stress concentrated at the contact surface may be effectively absorbed.

In some embodiments, the amount of the hollow inorganic particles 85 may decrease from the contact surface to an outer surface of the coating layer 195. For example, the amount of the hollow inorganic particles 85 may be relatively increased in an initial mixture batch of the plasma spray coating. In subsequent mixture batches, the amount of the hollow inorganic particles 85 may be gradually reduced to form the coating layer 192.

Figure 6:
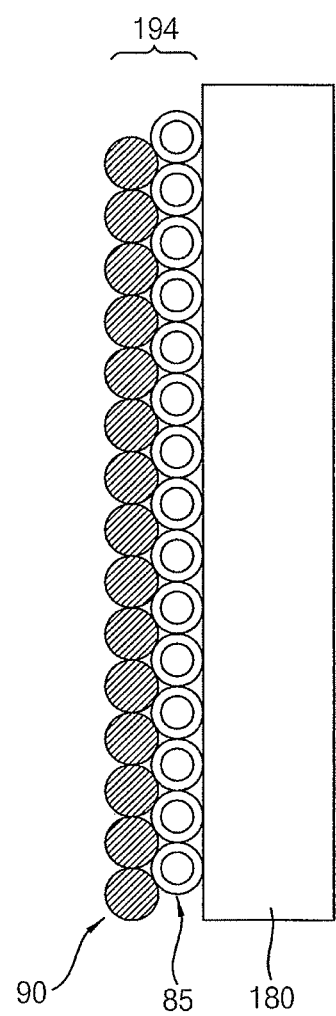

Referring to FIG. 6, the hollow inorganic particles 85 may be maximized at a contact surface between a coating layer 194 and the base 180, e.g., a majority of particles at the contact surface between the coating layer 194 and the base 180 may be hollow inorganic particles. In some embodiments, the contact surface may consist essentially of the hollow inorganic particles 85. The initial mixture batch of the plasma spray coating may substantially only include the hollow inorganic particles 85, and a propagation of the residual stress generated from a surface of the base 180 into the coating layer 194 may be thoroughly blocked.

An portion of the coating layer 194 above the contact surface may consist essentially of the inorganic coating particles 90. Mixture batches after the initial mixture batch may consist essentially of the inorganic coating particles 90.

As illustrated in FIG. 6, the contact surface with the base 180 may consist essentially of the hollow inorganic particles 85, and a capability of absorbing the residual stress may be maximized. A remaining portion of the coating layer 194 may consist essentially of the inorganic coating particles 90, and the mechanical strength of the coating layer 194 may be sufficiently achieved.

Figure 7:
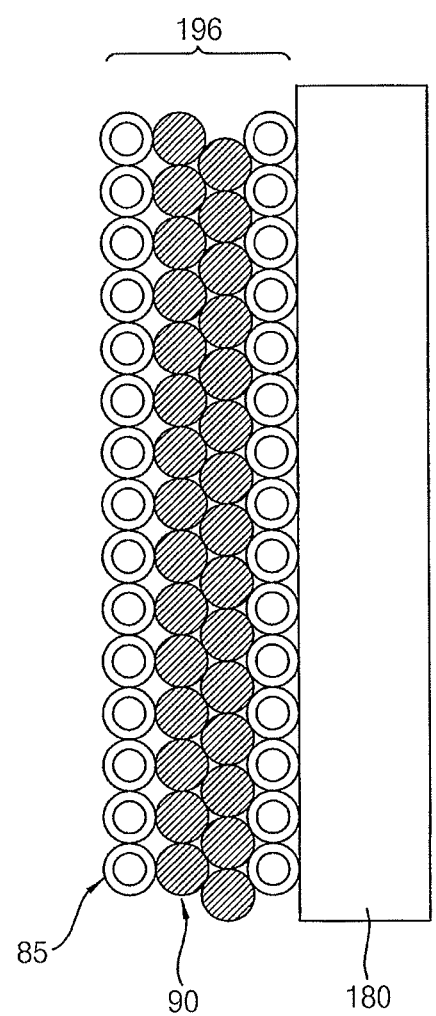

Referring to FIG. 7, the hollow inorganic particles 85 may be maximized at a contact surface between a coating layer 196 and the base 180, and an outer surface of the coating layer 196, e.g., a majority of particles at the contact surface between the coating layer 196 and the base 180, and the outer surface of the coating layer, may be hollow inorganic particles.

In some embodiments, the contact surface may consist essentially of the hollow inorganic particles 85. As also described with reference to FIG. 6, an initial mixture batch of the plasma spray coating may substantially only include the hollow inorganic particles 85.

The outer surface of the coating layer 196 may also consist essentially of the hollow inorganic particles 85. A final mixture batch of the plasma spray coating may substantially only include the hollow inorganic particles 85.

An portion between the contact surface and the outer surface of the coating layer 196 may consist essentially of the inorganic coating particles 90, and a mixture batch between the initial mixture batch and the final mixture batch may substantially only include the inorganic coating particles 90.

As described with reference to FIG. 7, the contact surface and the outer surface of the coating layer 196 may consist essentially of the hollow inorganic particles 90, and the residual stress generated from the contact surface and the outer shock may be blocked from being propagated into the coating layer 196. An intermediate portion of the coating layer 196 may consist essentially of the inorganic coating particles 90, and a desired mechanical strength of the coating layer 196 may be secured.

In embodiments illustrated with reference to FIGS. 5 to 7, a total amount of the hollow inorganic particles 85 in the coating layer may be controlled in a range from about 5 wt % to about 60 wt %. A hollow area defined by the hollow cores 55 per unit area of the coating layer may be in a range from about 1% to about 50%.

Figure 8:
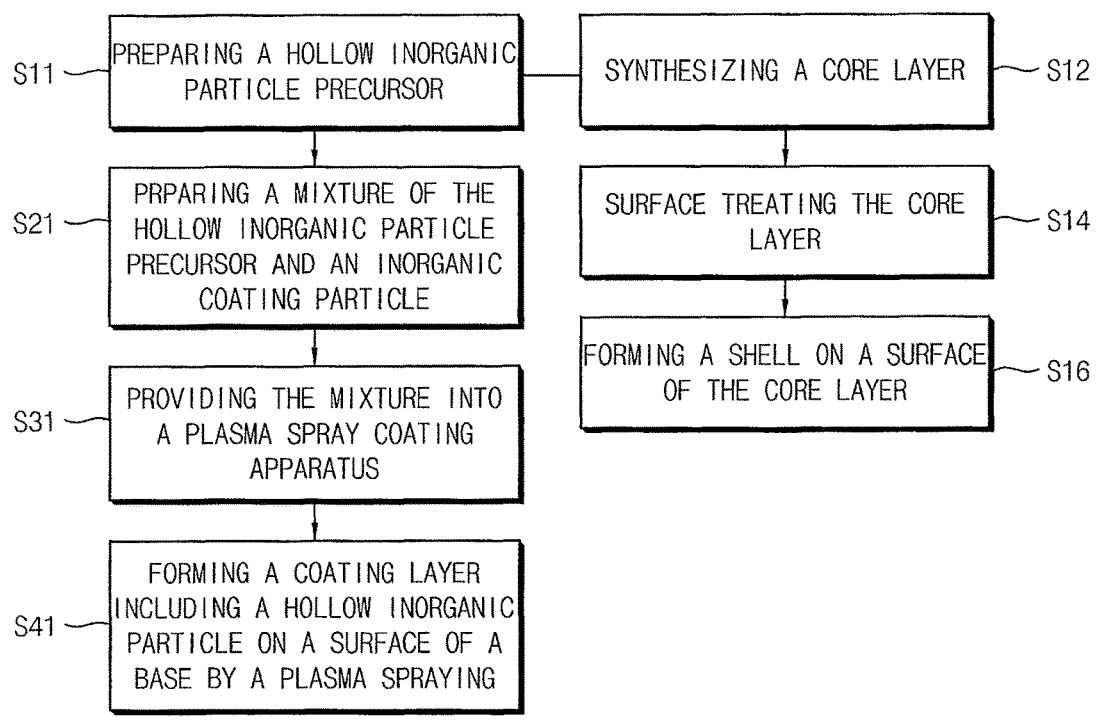
FIG. 8 illustrates a flow chart of a method of forming a coating layer in accordance with some example embodiments.
Figure 9:
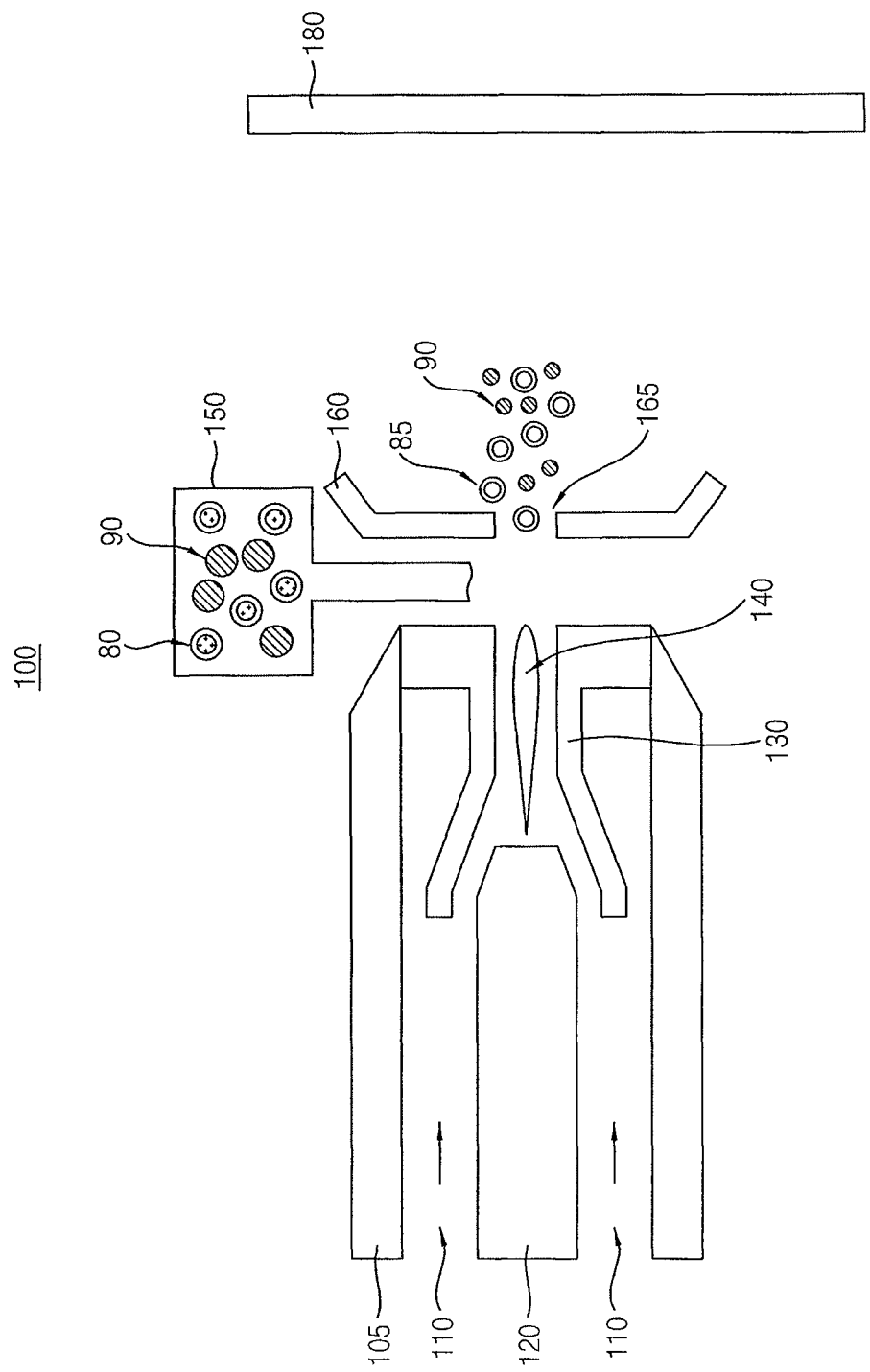
FIG. 9 illustrates a schematic cross-sectional view of a plasma spray coating method in accordance with some example embodiments.

FIG. 8 illustrates a flow chart of a method of forming a coating layer in accordance with some example embodiments. FIG. 9 illustrates a schematic cross-sectional view of a plasma spray coating method in accordance with some example embodiments.

Detailed descriptions on processes, materials and/or an apparatus substantially the same as or similar to those illustrated with reference to FIGS. 1 to 3 are omitted herein.

Referring to FIG. 8, in, e.g., an operation S11, a hollow inorganic particle precursor 80 (see FIG. 2) may be prepared.

In example embodiments, the hollow inorganic particle precursor 80 may be prepared through operations S12, S14 and S16 substantially the same as or similar to those illustrated with reference to FIGS. 1 and 2.

As described above, the hollow inorganic particle precursor 80 may have a core-shell structure that may include a core layer 50 formed of a polymeric material, and a shell 70 surrounding the core layer 50 and including, for example, yttria, alumina, silica, zirconia, yttrium fluoride, silicon carbide, or YSZ.

For example, in an operation S21, a mixture of the hollow inorganic particle precursor 80 and an inorganic coating particle 90 (see FIG. 3) may be prepared. As described above, the inorganic coating particle 90 may include a nano particle having a solid structure such as, for example, yttria, alumina, silica, zirconia, yttrium fluoride, silicon carbide, or YSZ.

In example embodiments, the operation S18 described with reference to FIGS. 1 and 2 may be omitted, and the mixture may be prepared before removing the core layer 50.

Referring to FIGS. 8 and 9, in, e.g., an operation S31, the mixture of the hollow inorganic particle precursor 80 and the inorganic coating particle 90 may be introduced into a plasma spray coating apparatus 100.

In example embodiments, the mixture may be stored in a powder injection port 150 of the plasma spray coating apparatus 100.

For example, in an operation S41, the mixture may be may be sprayed on a surface of a base 180 by a plasma spraying method, and a coating layer including a hollow inorganic particle 85 may be formed on the surface of the base 180.

In example embodiments, the mixture including the hollow inorganic particle precursor 80 may be provided in a plasma flame 140 created by a plasma gas flowing through a gas inlet 110 to be sprayed toward the base 180 through a spraying port 160.

For example, a temperature of the plasma flame 140 may be in a range from about 500° C. to about 1,000° C. In an embodiment, the temperature of the plasma flame 140 may be greater than about 1,000° C. The hollow inorganic particle precursor 80 and the inorganic coating particle 90 may be partially melted, the core layer 50 included in the hollow inorganic particle precursor 80 may be thermally decomposed and removed, and the hollow inorganic particle 85 may be formed during a plasma spraying process to be injected toward the base 180.

In some embodiments, as illustrated with reference to FIGS. 4 to 7, a distribution of the hollow inorganic particles 85 may be controlled in the coating layer. An amount of the hollow inorganic particle precursors 80 may be controlled in each mixture batch stored in the powder injection port 150, and a desired particle distribution in the coating layer may be obtained.

According to example embodiments as described above, the plasma spraying process may be performed in a state of the hollow inorganic particle precursor 80, and the hollow inorganic particle 85 from which the core layer 50 is removed may be formed in the plasma spray coating apparatus 100 or during the spraying process, and an additional thermal treatment for the formation of the hollow inorganic particle 85 may be omitted to save a process cost and a process time.

Figure 10:
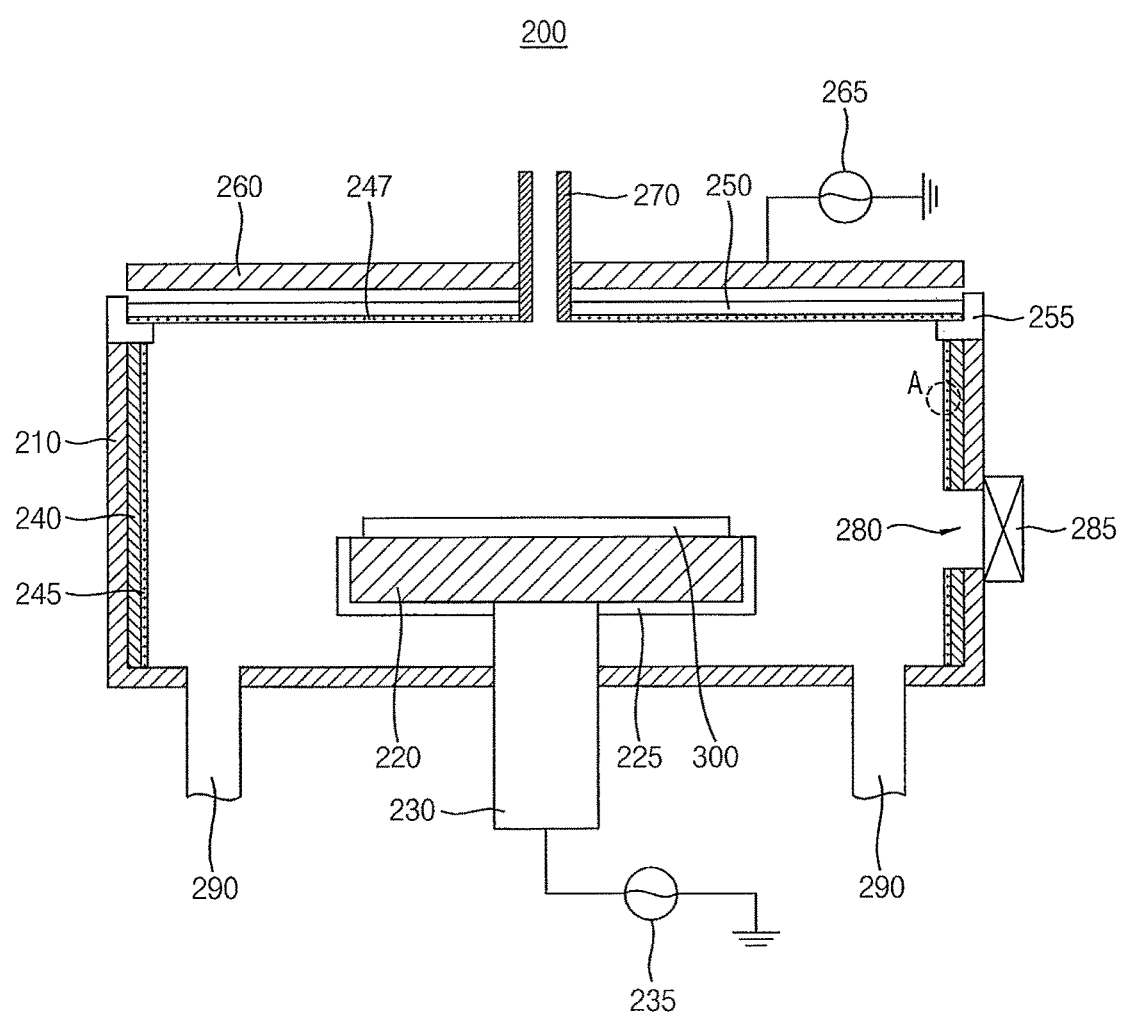
FIG. 10 illustrates a schematic cross-sectional view of a plasma treatment apparatus in accordance with example embodiments.

FIG. 10 illustrates a schematic cross-sectional view of a plasma treatment apparatus in accordance with example embodiments.

For example, the plasma treatment apparatus may be utilized as a plasma etching apparatus for a formation of various patterns in a semiconductor device. The plasma treatment apparatus may be also utilized for performing a surface treatment or a cleaning process on various layer structures.

Referring to FIG. 10, a plasma treatment apparatus 200 may include a chamber 210, a supporter 220 at a lower portion of the chamber 210, an electric field applying unit placed at an upper portion of the chamber 210, and power supplies 235 and 265 coupled to the supporter 220 and the electric field applying unit.

In some embodiments, a coil 260 may be employed as the electric field applying unit. In some embodiments, an antenna may be used as the electric filed applying unit.

The chamber 210 may serve as a body of the plasma treatment apparatus 200, and may include a conductive material such as aluminum or aluminum alloy. In an embodiment, an inner wall of the chamber 210 may be treated by an anodizing (e.g., an alumite treatment) for improving an anti-stain property.

In example embodiments, a liner 240 may be disposed on the inner wall of the chamber 210 to protect a surface of the chamber 210 from plasma. For example, the liner 240 may be disposed along an inner sidewall of the chamber 210 as illustrated in FIG. 10. In some embodiments, the liner 240 may be also disposed on a bottom of the chamber 210.

The liner 240 may include an insulation material such as, for example, quartz or alumite-treated aluminum.

In example embodiments, a first coating layer 245 may be formed on a surface of the liner 240. The first coating layer 245 may include the hollow inorganic particles 85 and the inorganic coating particles 90 as described above.

The first coating layer 245 may be formed from the plasma spray coating method as illustrated with reference to FIGS. 1 to 3, or FIGS. 8 and 9 using the liner 240 as a base.

The inner wall of the chamber 210 may be protected from ion-collision during a plasma treatment such as a plasma etching process by the first coating layer 245, and a particle generation from the plasma treatment apparatus 200 may be avoided.

In example embodiments, the first coating layer 245 may include the hollow inorganic particles 85 to effectively absorb the ion-collision. A residual stress caused by, e.g., a CTE mismatch with the liner 240 during the plasma spray coating may be buffered or absorbed by the hollow inorganic particles 85, and defects such as voids or cracks may be prevented in the first coating layer 245.

A window 250 providing a space for the coil 260 that may serve as the electric field applying unit may be disposed on an upper portion of the chamber 210. The window 250 may be supported by a connection member such as a joint ring 255 to cover the upper portion of the chamber 210. The window 250 may include a ceramic material such as quartz or alumina.

In some example embodiments, a second coating layer 247 may be formed on the surface of the window 250.

The second coating layer 247 may include a material substantially the same as or similar to that of the first coating layer 245, and may be formed through the plasma spray coating method as described with reference to FIGS. 1 to 3, or FIGS. 8 and 9.

The coil 260 may be disposed on the window 260, and a first power supply 265 may be coupled to the coil 260. A high frequency power may be applied to the coil 260 by the first power supply 265, and an electric field may be induced in the chamber 210.

A substrate 300 may be loaded on the supporter 220 at the lower portion of the chamber 210. The supporter 220 may include a rotatable susceptor. A plurality of slots may be formed on the supporter 220, and a plurality of the substrates 300 may be loaded on the supporter 220.

The supporter 220 may be rotatably coupled to a chuck 230 extending through a bottom of the chamber 210. A second power supply 235 may be coupled to the chuck 230 to apply a high frequency power to the supporter 220, a reactive gas may be transformed into plasma by the induced electric field, and the plasma may be directed to the substrate 300.

In some embodiments, an insulator wall 225 surrounding a sidewall and a bottom of the supporter 220 may be further formed. For example, the insulator wall 225 may include a ceramic material such as quartz or alumina. In an embodiment, a coating layer according to example embodiments may be further formed on a surface of the insulator wall 225.

A reactive gas supply 270 may be connected to the upper portion of the chamber 210 to provide the reactive gas such as argon or nitrogen into the chamber 210. In an embodiment, the reactive gas supply 270 may be connected to a lateral portion of the chamber 210.

For example, an exhaust port 290 may be provided at a bottom of the chamber 210. For example, the exhaust port 290 may be coupled to an inside of the chamber 210 via a vacuum pump.

An opening 280 for transporting the substrate 300 may be provided at the lateral portion of the chamber 210. A gate 285 for covering or exposing the opening 280 may be further disposed at an outer lateral portion of the chamber 210.

As illustrated in FIG. 10, the coating layers 245 and 247 according to example embodiments may be formed on the surfaces of the liner 240 and the window 250 included in the plasma treatment apparatus 200. In an embodiment, the coating layer may be also formed on various components including, for example, the supporter 220, the opening 280, or the reactive gas supply 270, may be exposed to ion-collision.

Figure 11:
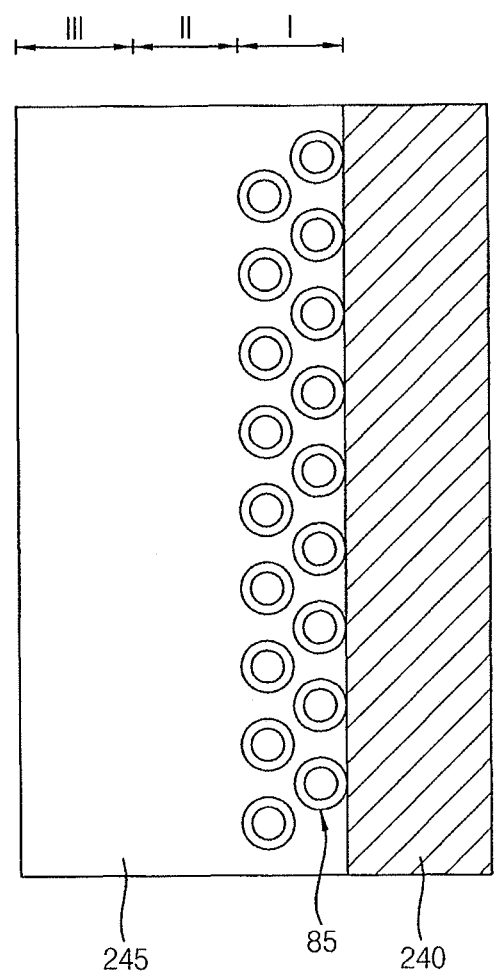
FIGS. 11 to 13 illustrate cross-sectional views of structures of a coating layer formed in a plasma treatment apparatus in accordance with example embodiments.
Figure 12:
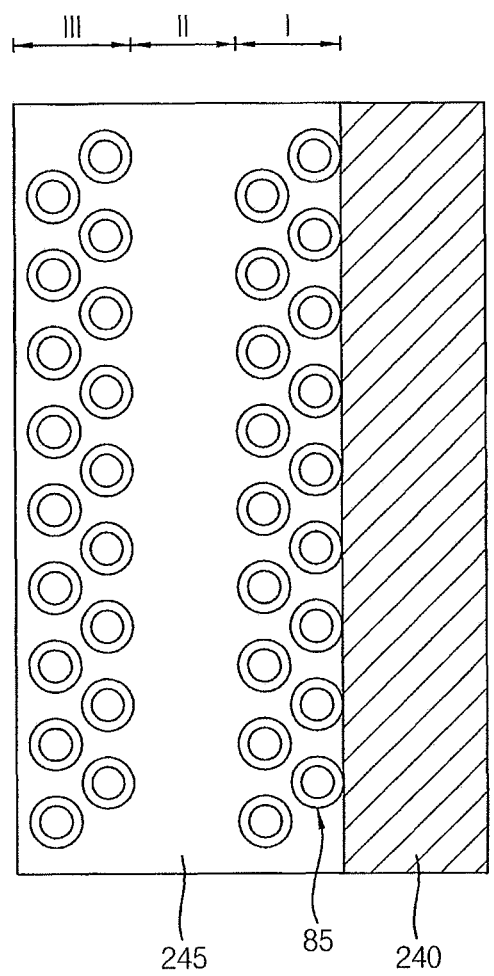
Figure 13:
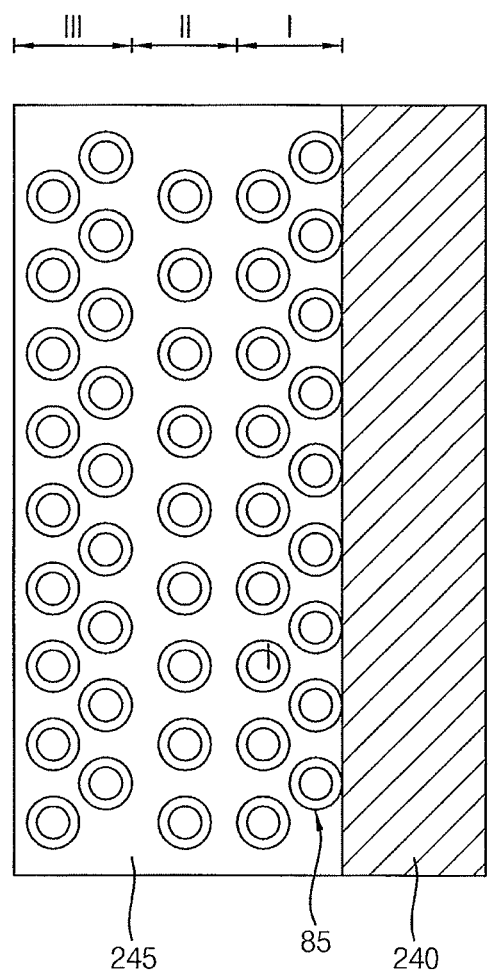

FIGS. 11 to 13 illustrate cross-sectional views of structures of a coating layer formed in a plasma treatment apparatus in accordance with example embodiments. For example, FIGS. 11 to 13 illustrate partially enlarged cross-sectional views of a portion "A" indicated in FIG. 10.

As illustrated in FIGS. 11 to 13, the first coating layer 245 may include a contact portion I contacting the surface of the liner 240, an outer portion III exposed to the inside of the chamber 210, and an intermediate portion II between the contact portion I and the outer portion III. In FIGS. 11 to 13, the inorganic coating particles 90 (see FIGS. 4 to 7) may be distributed in an area of the first coating layer 245 except for an area in which the hollow inorganic particles 85 are distributed.

Referring to FIG. 11, the hollow inorganic particles 85 may be concentrated in the contact portion I. For example, the intermediate portion II and the outer portion III may consist essentially of the inorganic coating particles 90.

Thus, a residual stress caused by a CTE mismatch between the liner 240 and the first coating layer 245 may be effectively absorbed. A mechanical strength of the first coating layer 245 may be obtained by the inorganic coating particles 90 relatively concentrated in the intermediate portion II and the outer portion III In some embodiments, an initial mixture batch stored in the powder injection port 150 of the plasma spray coating apparatus 100 illustrated in FIGS. 3 and 9 may include a relatively large amount of the hollow inorganic particles 85, or may consist essentially of the hollow inorganic particles 85. Subsequent mixture batches may consist essentially of the inorganic coating particles 90 to form the intermediate portion II and the outer portion III.

Referring to FIG. 12, in the first coating layer 245, the hollow inorganic particles 85 may be concentrated in the contact portion I and the outer portion III, and the intermediate portion II may consist essentially of the inorganic coating particles 90, and the residual stress in the contact portion I and the ion-collision in the outer portion III may be effectively absorbed. The mechanical strength of the first coating layer 245 may be obtained by the inorganic coating particles 90 in the intermediate portion II.

In some embodiments, the initial mixture batch and a final mixture batch stored in the powder injection port 150 of the plasma spray coating apparatus 100 may include a relatively large amount of the hollow inorganic particles 85, or may consist essentially of the hollow inorganic particles 85. An intermediate mixture batch between the initial mixture batch and the final mixture batch may consist essentially of the inorganic coating particles 90.

Referring to FIG. 13, in the first coating layer 245, the hollow inorganic particles 85 may be distributed throughout the contact portion I, the intermediate portion II and the outer portion III. The contact portion I and the outer portion III may consist essentially of the hollow inorganic particles 85, or may include a relatively large amount of the hollow inorganic particles 85.

The intermediate portion II may include a smaller amount of the hollow inorganic particles 85 than those of the contact portion I and the outer portion III. The mechanical strength of the first coating layer 245 may be achieved by the intermediate portion II, and a stress transfer between the contact portion I and the outer portion III may be buffered by the intermediate portion II.

In some embodiments, the initial mixture batch and the final mixture batch stored in the powder injection port 150 of the plasma spray coating apparatus 100 may include a relatively large amount of the hollow inorganic particles 85, or may consist essentially of the hollow inorganic particles 85. The intermediate mixture batch between the initial mixture batch and the final mixture batch may include a relatively large amount of the inorganic coating particles 90 and a relatively small amount of the hollow inorganic particles 85.

As described above, while performing the plasma spray coating process, the coating layer may be formed from a plurality of the mixture batches. An amount of the hollow inorganic particles 85 included in each mixture batch may be controlled, and a particle distribution in the coating layer may be adjusted.

Figure 14:
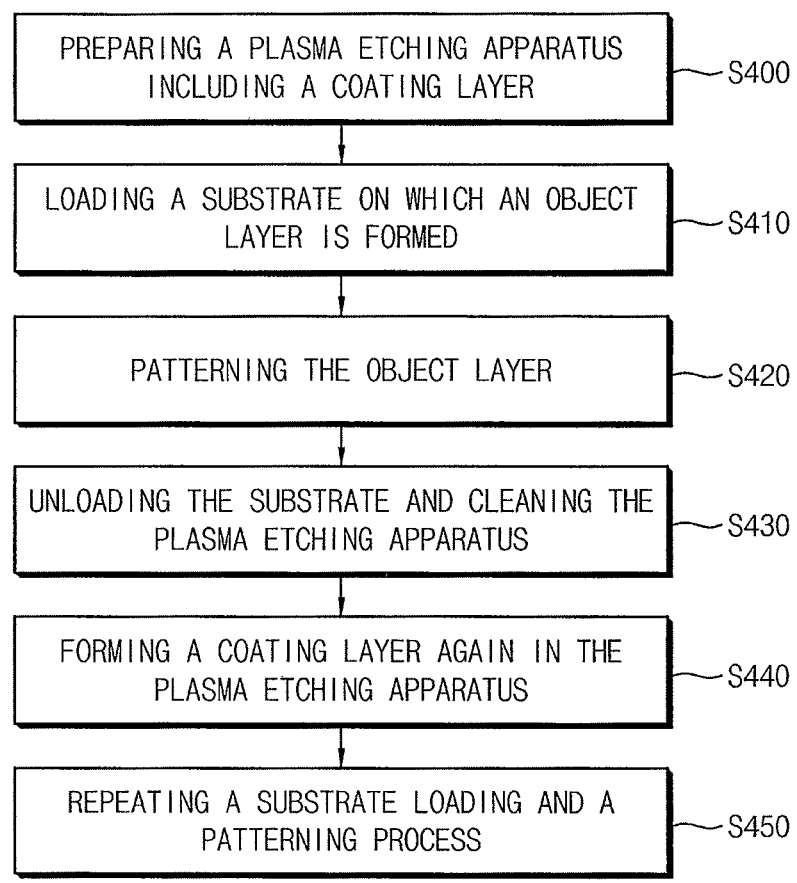
FIG. 14 illustrates a flow chart of a method of forming a pattern in accordance with example embodiments.
Figure 15:
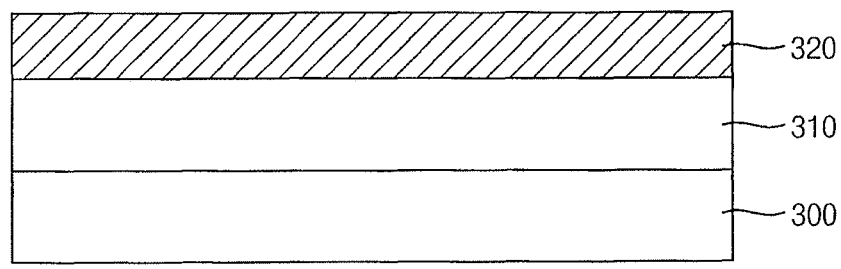
FIGS. 15 to 17 illustrate cross-sectional views of a method of forming a pattern in accordance with example embodiments.
Figure 16:
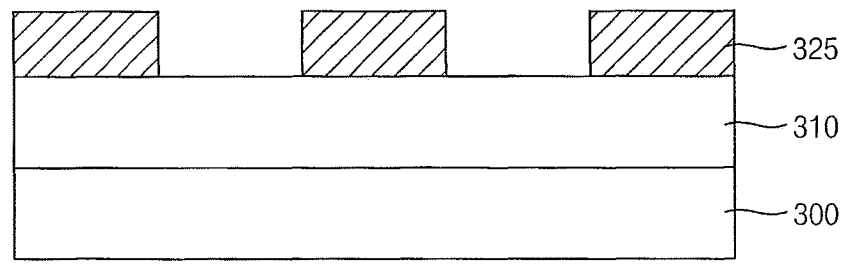
Figure 17:
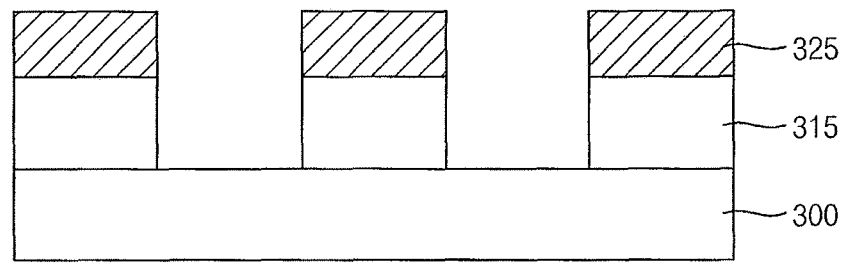

FIG. 14 illustrates a flow chart of a method of forming a pattern in accordance with example embodiments. FIGS. 15 to 17 illustrate cross-sectional views of a method of forming a pattern in accordance with example embodiments.

For example, FIGS. 14 to 17 illustrate a method of forming a pattern utilizing the plasma treatment apparatus 200 of FIG. 10.

Referring to FIG. 14, in, e.g., an operation S400, a plasma etching apparatus including a coating layer therein may be prepared.

In example embodiments, the plasma treatment apparatus 200 illustrated with reference to FIG. 10 may be utilized as the plasma etching apparatus. As described above, the coating layer may be formed on surfaces of components such as a liner and a window included in the plasma treatment apparatus 200. The coating layer may be formed by the plasma spray coating process illustrated with reference to FIGS. 1 to 3, or FIGS. 8 and 9, and may include the hollow inorganic particles 85.

As illustrated in FIGS. 11 to 13, the hollow inorganic particles 85 may be relatively concentrated in a contact portion with the component and/or an outer portion toward an inside of a chamber.

Referring to FIGS. 14, 15 and 16, in, e.g., an operation S410, a substrate 300 including an object layer 310 formed thereon may be loaded in the plasma etching apparatus. The substrate 300 may be placed on the supporter 220 of the plasma treatment apparatus 200 illustrated in FIG. 10. For example, a plurality of the substrates 300 may be disposed on each slot of the supporter 220.

As illustrated in FIG. 15, the object layer 310 and a mask layer 320 may be sequentially formed on the substrate 300.

The substrate 300 may include a semiconductor substrate such as a silicon substrate, a germanium substrate or a silicon-germanium substrate. A silicon-on-insulator (SOI) substrate or a germanium-on-insulator (GOI) substrate may be also used as the substrate 300. The substrate 300 may also include a group III-V compound such as, for example, InP, GaP, GaAs, or GaSb.

The object layer 310 may be converted into a predetermined or desired pattern by a photo-lithography process. In some embodiments, the object layer 310 may be formed of an insulation material such as silicon oxide, silicon nitride and/or silicon oxynitride. In some embodiments, the object layer 310 may be formed of a conductive material such as a metal, a metal silicide, a metal nitride, a metal silicide nitride or doped polysilicon. In some embodiments, the object layer 310 may be formed of a semiconductor material such as polysilicon.

The object layer 310 may be formed by one or more of a chemical vapor deposition (CVD) process, a plasma enhanced chemical vapor deposition (PECVD) process, a low pressure chemical vapor deposition (LPCVD) process, a high density plasma chemical vapor deposition (HDP-CVD) process, a spin coating process, a sputtering process, or an atomic layer deposition (ALD) process.

The mask layer 320 may be formed of a photoresist material by, e.g., a spin coating process. In some embodiments, the mask layer 320 may be formed of a silicon-based or carbon-based spin-on hardmask (SOH) material.

Referring to FIG. 16, the mask layer 320 may be partially removed to form a mask pattern 325. A top surface of the object layer 310 may be exposed by the mask pattern 325.

In some embodiments, the mask layer 320 may be partially removed by exposure and developing processes to form the mask pattern 325.

In example embodiments, the substrate 300 on which the mask pattern 325 is formed may be loaded in the plasma treatment apparatus 200.

Referring to FIGS. 14 and 17, in, e.g., an operation S420, the object layer 310 may be patterned to form an object layer pattern 315.

In example embodiments, a plasma etching process may be performed in the plasma treatment apparatus 200. The mask pattern 325 may serve as an etching mask, and the object layer 310 may be partially removed to form the object layer pattern 315.

While performing the plasma etching process, the components of the plasma treatment apparatus 200 may be protected by the coating layer including the hollow inorganic particles 85, and damage by, e.g., ion-collision and a generation of particles from the components, may be avoided.

Referring again to FIG. 14, in, e.g., an operation S430, the substrate 300 on which the object layer pattern 315 is formed may be unloaded from the plasma etching apparatus. The mask pattern 325 may be removed by, e.g., an ashing process and/or a strip process.

The object layer pattern 315 may be provided as an insulation pattern including, e.g., a contact hole or a trench.

In an embodiment, the object layer pattern 315 may include the conductive material, and the object layer pattern 315 may serve as a conductive pattern such as, for example, a wiring, a contact, or a gate electrode.

After unloading the substrate 300, the components of the plasma etching apparatus may be cleaned. For example, the coating layer formed on the liner and the window may be removed by the cleaning process.

In example embodiments, a generation of cracks in the coating layer may be prevented by the hollow inorganic particles 85, and an outgassing caused when chemicals are captured in the cracks during the cleaning process may be prevented.

Subsequently, in, e.g., an operation S440, a coating layer may be formed again in the plasma etching apparatus. In example embodiments, the plasma spray coating process illustrated with reference to FIGS. 1 to 3, or FIGS. 8 and 9 may be repeated to form the coating layer including the hollow inorganic particles 85 again.

In an operation S450, e.g., processes of operations S400 through S430 may be repeated to perform a plasma etching process again. For example, a substrate 300 may be loaded on the supporter 220 of the plasma treatment apparatus 200, and an object layer 310 may be patterned.

By way of summation and review, example embodiments relate to methods of forming coating layer using inorganic particles, plasma treatment apparatus including the coating layer, and methods of forming patterns using the plasma treatment apparatus.

Example embodiments may provide a method of forming a coating layer having improved mechanical properties. Example embodiments may provide a plasma treatment apparatus including a coating layer of improved mechanical properties. Example embodiments may provide a method of forming a pattern utilizing the plasma treatment apparatus.

According to example embodiments, hollow inorganic particles and inorganic coating particles may be mixed, and the mixture may be sprayed on a component such as a liner of a plasma treatment apparatus by a plasma spray coating process to form a coating layer. The hollow inorganic particles may have an elasticity and a shock absorption rate greater than those of the inorganic coating particles that may have a solid structure, and a residual stress and a shock from ion-collision generated during the formation of the coating layer may be buffered by the hollow inorganic particles to improve durability of the coating layer. A ratio of the hollow inorganic particle to the inorganic coating particles may be controlled while performing the plasma spray coating process, and the hollow inorganic particles may be concentrated at a desired portion of the coating layer.

The coating layer in accordance with example embodiments may be also applied in various semiconductor fabrication apparatuses such as, for example, a sputtering apparatus or a CVD apparatus.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of forming a coating layer on a base, the method comprising:
    preparing hollow inorganic particles, each hollow inorganic particle including a shell surrounding a hollow core;
    preparing inorganic coating particles of a solid structure;
    forming a mixture of the hollow inorganic particles and the inorganic coating particles; and
    spraying the mixture on a surface of the base by a plasma spray coating process such that the coating layer has a varying concentration, in a thickness direction of the coating layer, of the hollow inorganic particles relative to the inorganic coating particles,
    wherein the coating layer includes a first region including a contact surface of the coating layer with the base, a second region including an outer surface of the coating layer and a midregion between the first region and the second region,
    wherein the concentration of the hollow inorganic particles relative to the inorganic coating particles in the first region is higher than that in the midregion.

2. The method as claimed in claim 1, wherein the inorganic coating particles include one or more of yttria, alumina, zirconia, silica, yttrium fluoride, silicon carbide, or yttria-stabilized zirconia.

3. The method as claimed in claim 1, wherein preparing the hollow inorganic particles includes:
    synthesizing a core layer including a polymeric material;
    surface-treating the core layer;
    forming the shell including an inorganic material on a surface of the core layer; and
    removing the core layer.

4. The method as claimed in claim 3, wherein the shell is formed using powder of one or more of yttria, alumina, zirconia, silica, yttrium fluoride, silicon carbide, or yttria-stabilized zirconia.

5. The method as claimed in claim 3, wherein synthesizing the core layer includes a liquid-phase polymerization of monomers.

6. The method as claimed in claim 3, wherein surface-treating the core layer includes forming a surface activation layer on the surface of the core layer.

7. The method as claimed in claim 3, wherein removing the core layer includes a thermal decomposition or an evaporation of the core layer by a thermal treatment.

8. The method as claimed in claim 1, wherein spraying the mixture on the surface of the base by the plasma spray coating process is divided into a plurality of cycles, the cycles having different concentrations of the hollow inorganic particles relative to the inorganic coating particles.

9. The method as claimed in claim 8, wherein the mixture is injected in a plasma spray coating apparatus as a plurality of mixture batches, the mixture batches having different mixture ratios of the hollow inorganic particles and the inorganic coating particles.

10. The method as claimed in claim 9, further comprising varying the mixture ratio of the hollow inorganic particles to the inorganic coating particles included in each mixture batch such that the concentration of the hollow inorganic particles in the coating layer formed on the surface of the base is varied as the coating layer is formed.

11. The method as claimed in claim 10, wherein the concentration of the hollow inorganic particles relative to the inorganic coating particles is greatest in the first region, the concentration of the hollow inorganic particles relative to the inorganic coating particles diminishing towards the outer surface of the coating layer.

12. The method as claimed in claim 10, wherein the concentration of the hollow inorganic particles relative to the inorganic coating particles is least in the midregion.

13. The method as claimed in claim 12, wherein the midregion consists essentially of the inorganic coating particles.

14. The method as claimed in claim 1, wherein an amount of the hollow inorganic particles in the coating layer is in a range from about 5 weight percent to about 60 weight percent based on a total weight of the coating layer.

15. A method of forming a coating layer, the method comprising:
preparing hollow inorganic particle precursors, each hollow inorganic particle precursor including a polymer core layer and a shell surrounding the polymer core layer;
preparing inorganic coating particles of a solid structure;
forming a mixture of the hollow inorganic particle precursors and the inorganic coating particles; and
spraying the mixture on a surface of a base by a plasma spray coating process, wherein spraying the mixture includes transforming the hollow inorganic particle precursors into hollow inorganic particles from which the polymer core layer is removed.

16. The method as claimed in claim 15, further comprising injecting the mixture into a powder injection port of a plasma spray coating apparatus,
wherein the mixture passes a spraying port of the plasma spray coating apparatus to form the hollow inorganic particles.

17. The method as claimed in claim 15, wherein the shell and the inorganic coating particles include one or more of yttria, alumina, zirconia, silica, yttrium fluoride, silicon carbide, or yttria-stabilized zirconia.

18. A method of forming a coating layer, the method comprising:
forming multiple spray coatings using one or more of hollow inorganic particles or solid inorganic coating particles, the multiple spray coatings having different weight ratios of the hollow inorganic particles and the solid inorganic coating particles; and
spraying the multiple spray coatings having different weight ratios in a plurality of cycles to form a coating layer including the hollow inorganic particles and the solid inorganic coating particles on an inner wall of a plasma treatment apparatus chamber by a plasma spray coating process such that the coating layer has a varying concentration, in a thickness direction of coating layer, of the hollow inorganic particles relative to the inorganic coating particles,
wherein the coating layer includes a first region including a contact surface of the coating layer with the base, a second region including an outer surface of the coating layer and a midregion between the first region and the second region,
wherein the concentration of the hollow inorganic particles relative to the inorganic coating particles in the first region is higher than that in the midregion.

19. The method as claimed in claim 18,
wherein the concentration of the hollow inorganic particles relative to the inorganic coating particles decreases, in a thickness direction of the coating layer, from at the contact surface of the coating layer with the inner wall of the plasma treatment apparatus chamber, for at least a portion of a thickness of the coating layer.

* * * * *